(12) United States Patent
Wong

(10) Patent No.: US 11,431,328 B1
(45) Date of Patent: Aug. 30, 2022

(54) SYSTEM AND METHOD FOR DYNAMICALLY RECONFIGURING CLOCK OUTPUT SIGNALS

(71) Applicant: Keysight Technologies, Inc., Santa Rosa (CA)

(72) Inventor: Hun Wey Wong, Singapore (SG)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/512,865

(22) Filed: Oct. 28, 2021

(51) Int. Cl.
*H03K 5/00* (2006.01)
*G06F 1/08* (2006.01)
*H03K 19/20* (2006.01)
*H03K 21/08* (2006.01)

(52) U.S. Cl.
CPC ........... *H03K 5/00006* (2013.01); *G06F 1/08* (2013.01); *H03K 19/20* (2013.01); *H03K 21/08* (2013.01)

(58) Field of Classification Search
CPC .... H03K 5/00006; H03K 19/20; H03K 21/08; H03K 21/10; H03K 3/012; G06F 1/04; G06F 1/08; G06F 1/3203; G06F 1/324; G06F 1/3234; H03B 5/36; H03B 5/04; H03B 5/32
See application file for complete search history.

(56) References Cited

U.S. PATENT DOCUMENTS

| | | | |
|---|---|---|---|
| 9,703,314 B2 * | 7/2017 | Pessa | G06F 1/324 |
| 2011/0133793 A1 | 6/2011 | Wheelock et al. | |
| 2011/0200161 A1 * | 8/2011 | Tasic | H03L 7/1976 377/48 |
| 2014/0247074 A1 * | 9/2014 | Matsushita | H03K 23/667 327/115 |
| 2018/0076818 A1 * | 3/2018 | Yorita | H03L 7/18 |
| 2018/0239307 A1 * | 8/2018 | Tsutsumi | H03B 5/32 |
| 2021/0194428 A1 * | 6/2021 | Haneda | G06F 1/04 |

OTHER PUBLICATIONS

"Glitchless Frequency Adjustment Using Fractional Output Divider AN-970 Application Note", Renesas Electronics Corporation, May 10, 2017, pp. 1-7.
"Programmable Clock Generator 5P49V5901", Renesas Electronics Corporation, Feb. 21, 2019, pp. 1-38.

* cited by examiner

*Primary Examiner* — John W Poos

(57) ABSTRACT

A system is provided for dynamically reconfiguring clock output signals, without clock loss and glitches. The system includes an oscillator generating a clock input signal, first and second dynamic reconfigurable clock dividers, an AND logic gate and an interface. The first and second dynamic reconfigurable clock dividers include counters that output first and second clock output signals having multiple periodic cycles, respectively, and cycle complete signals in response to completion of each periodic cycle. The AND logic gate outputs an aggregated cycle complete signal in response to the cycle complete signals from the first and second dynamic reconfigurable clock dividers. The interface provides reconfiguration commands to the first dynamic reconfigurable clock divider changing frequency and/or phase of the first clock output signal. The first counter maintains the frequency and phase until receiving the aggregated cycle complete signal from the AND logic gate, and then implementing the changed frequency and/or phase.

20 Claims, 9 Drawing Sheets

SYSTEM AND METHOD FOR DYNAMICALLY RECONFIGURING CLOCK OUTPUT SIGNALS

BACKGROUND

Clock signals are usually integral to any high-speed digital system. For example, functions of a clock include synchronizing the transfer of data and driving devices, such as converters, switches and switch regulators. Properties of the clock, such as frequency and phase, significantly impact operational characteristics and performance of the digital system being driven. Therefore, the ability to reconfigure the clock on-the-fly, meaning while the digital system is in operation performing its designed functions, is a powerful tool that opens up many possibilities for design improvement on a system level.

Conventionally, a phase-locked loop (PLL) may be used for clock reconfiguration, where a new clock setting with regard to frequency and/or phase of a clock signal is input into the PLL. FIG. 1A shows an example of clock loss in an illustrative clock signal provided using a PLL and subjected to conventional reconfiguration on-the-fly. Referring to FIG. 1A, an original clock signal 111 is reconfigured to a new clock signal 112 having a different frequency in response to a new clock setting. However, the new clock setting causes the PLL to enter a reset state, during which there is no clock output, resulting in clock loss 115 for the entire time duration the PLL is in the reset state. The clock loss for a duration of time will result in either non-operational or incorrect operation of a digital system. Also, phase offset of the clock output may only be adjusted relative to a clock input, and not relative other clock outputs operating from the same clock input. With regard to spread spectrum settings of the PLL, there are limited capabilities as the spread spectrum settings cannot be dynamically reconfigured on-the-fly. Rather, the spread spectrum settings must either be changed while the PLL is effectively paused in the reset state or in certain cases will not be able to be changed at all.

A counter may also be used for conventional clock reconfiguration, where the counter functions as a clock divider to vary the frequency and/or phase of the clock signal. FIG. 1B shows an example of a glitch in an illustrative clock signal provided using the counter and subjected to conventional reconfiguration on-the-fly. Referring to FIG. 1B, an original clock signal 121 is reconfigured to a new clock signal 122 having a different phase in response to a new clock setting. However, use of the counter causes a glitch 125 or spurious signal during the transition from the original clock signal 121 to the new clock signal 122 whenever clock reconfiguration is performed on-the-fly. A glitch in a clock signal can potentially cause undesirable logic transition and then propagate those faulty logic transition to other parts of the digital system.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like devices.

DETAILED DESCRIPTION

Figure 1A:
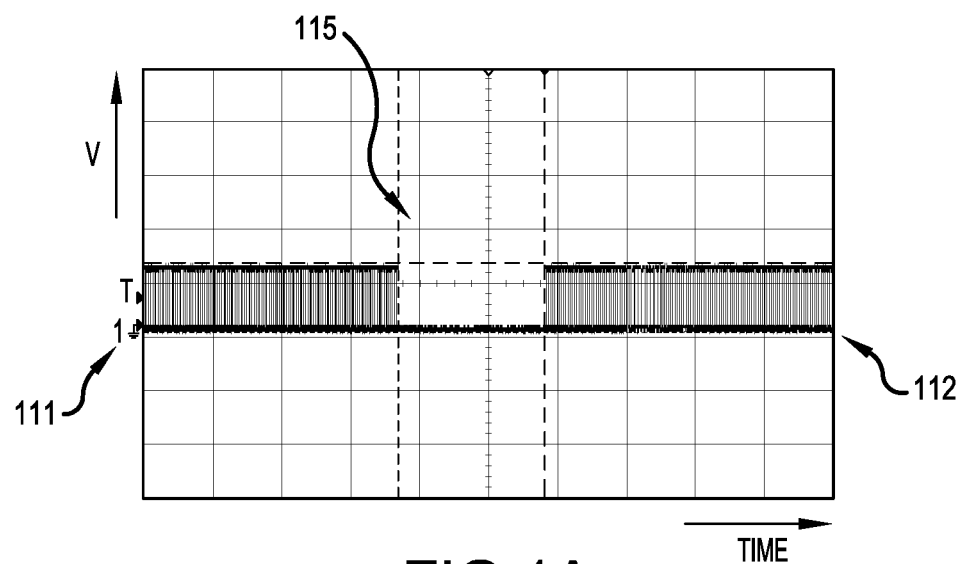
FIG. 1A shows clock loss in an illustrative clock signal reconfigured on-the-fly using conventional reconfiguration.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one having ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, the various embodiments herein enable seamless reconfiguration of a system clock, without clock loss and without glitches. Multiple clock signals output by different counters in the system clock may be dynamically reconfigured to change frequency, phase relative to one another and/or spread spectrum settings on-the-fly.

According to a representative embodiment, a system is provided for dynamically reconfiguring clock output signals, without clock loss and without glitches. The system includes an oscillator configured to generate a clock input signal; a first dynamic reconfigurable clock divider including a first counter configured to output a first clock output signal having multiple first periodic cycles in response to a first counting operation on the clock input signal, and to output a first cycle complete signal in response to completion of a current first periodic cycle of the multiple first periodic cycles after receiving at least one first reconfiguration command, where the first clock output signal has a first frequency and a first phase; a second dynamic reconfigurable clock divider including a second counter configured to output a second clock output signal having multiple second periodic cycles in response to a second counting operation on the clock input signal, and to output a second cycle complete signal in response to completion of a current second periodic cycle of the multiple second periodic cycles after receiving at least one second reconfiguration command, where the second clock output signal has a second frequency and a second phase; an AND logic gate configured to output an aggregated cycle complete signal in response to receiving both the first cycle complete signal and the second cycle complete signal, where the aggregated cycle complete signal is input to the first and second dynamic reconfigurable clock dividers; and an interface configured to provide the at least one first reconfiguration command to the first dynamic reconfigurable clock divider, where the at least one first reconfiguration command is for changing the first frequency and/or the first phase of the first clock output signal or for disabling the first clock output signal.

After the first dynamic reconfigurable clock divider receives the at least one first reconfiguration command, the first counter maintains the first frequency and the first phase until completing the current first periodic cycle of the plurality of first periodic cycles and receiving the aggregated cycle complete signal from the AND logic gate, and then implementing the changed first frequency and/or the changed first phase of the first clock output signal, or disabling the first clock output signal. Also, after the second dynamic reconfigurable clock divider receives the at least one second reconfiguration command, the second counter maintains the second frequency and the second phase until completing the current second periodic cycle of the plurality of second periodic cycles and receiving the aggregated cycle complete signal from the AND logic gate, and then implementing the changed second frequency and/or the changed second phase of the second clock output signal.

According to another representative embodiment, a method is provided for dynamically reconfiguring clock output signals, output by respective dynamic reconfigurable clock dividers, without clock loss and without glitches. The method includes receiving a clock input signal; outputting from a first dynamic reconfigurable clock divider a first clock output signal having multiple first periodic cycles at a first frequency and a first phase in response to a first counting operation on the clock input signal; outputting from a second dynamic reconfigurable clock divider a second clock output signal having multiple second periodic cycles at a second frequency and a second phase in response to a second counting operation on the clock input signal; receiving at least one first reconfiguration command at the first dynamic reconfigurable clock changing at least one of the first frequency or the first phase of the first clock output signal; outputting from the first dynamic reconfigurable clock divider a first cycle complete signal in response to completion of a current first periodic cycle of the multiple first periodic cycles after receiving at the least one reconfiguration command; outputting from the second dynamic reconfigurable clock divider a second cycle complete signal in response to completion of a current second periodic cycle of the multiple second periodic cycles after receiving at the least one reconfiguration command; providing an aggregated cycle complete signal in response to receiving both the first cycle complete signal and the second cycle complete signal; inputting the aggregated cycle complete signal to the first and second dynamic reconfigurable clock dividers; and in response to the at least one first reconfiguration command, maintaining the first frequency and the first phase until completing the current first periodic cycle of the plurality of first periodic cycles and receiving the aggregated cycle complete signal, and then implementing the changed first frequency and/or the changed first phase.

According to another representative embodiment, a system is provided for dynamically reconfiguring multiple clock output signals, without clock loss and without glitches. The system includes an oscillator configured to generate a clock input signal, a first dynamic reconfigurable clock divider, a second dynamic reconfigurable clock divider, an AND logic gate and an interface. The first dynamic reconfigurable clock divider includes a first counter configured to output a first clock output signal having multiple first periodic cycles in response to a first counting operation on the clock input signal, and to output a first cycle complete signal in response to completion of a current first periodic cycle of the multiple first periodic cycles after receiving at least one reconfiguration command for reconfiguring or disabling the first clock output signal, where the first clock output signal has a first frequency and a first phase (phase offset). Reconfiguring a clock output signal refers to changing one or more of the frequency or phase of the clock output signal, and disabling the clock output signal refers to stopping or pausing the clock output signal altogether. The second dynamic reconfigurable clock divider includes a second counter configured to output a second clock output signal having multiple second periodic cycles in response to a second counting operation on the clock input signal, and to output a second cycle complete signal in response to completion of a current second periodic cycle of the multiple second periodic cycles after receiving at least one reconfiguration command for reconfiguring or disabling the second clock output signal, where the second clock output signal has a second frequency and a second phase (phase offset). The AND logic gate is configured to output an aggregated cycle complete signal in response to receiving both the first cycle complete signal and the second cycle complete signal, where the aggregated cycle complete signal is input to the first and second dynamic reconfigurable clock dividers. The interface is configured to provide a clock divider start command to the first and second dynamic reconfigurable clock dividers to either start or reconfigure simultaneously the first and second counting operations of the first and second counters.

The interface is further configured to provide reconfiguration commands to the first dynamic reconfigurable clock divider in response to a user input changing the first frequency and/or the first phase. After the first dynamic reconfigurable clock divider receives the reconfiguration commands, the first counter maintains the first frequency and the first phase until completing a current first periodic cycle of the multiple first periodic cycles and receiving the aggregated cycle complete signal from the AND logic gate, and then implementing the changed first frequency and/or the changed first phase.

Figure 2:
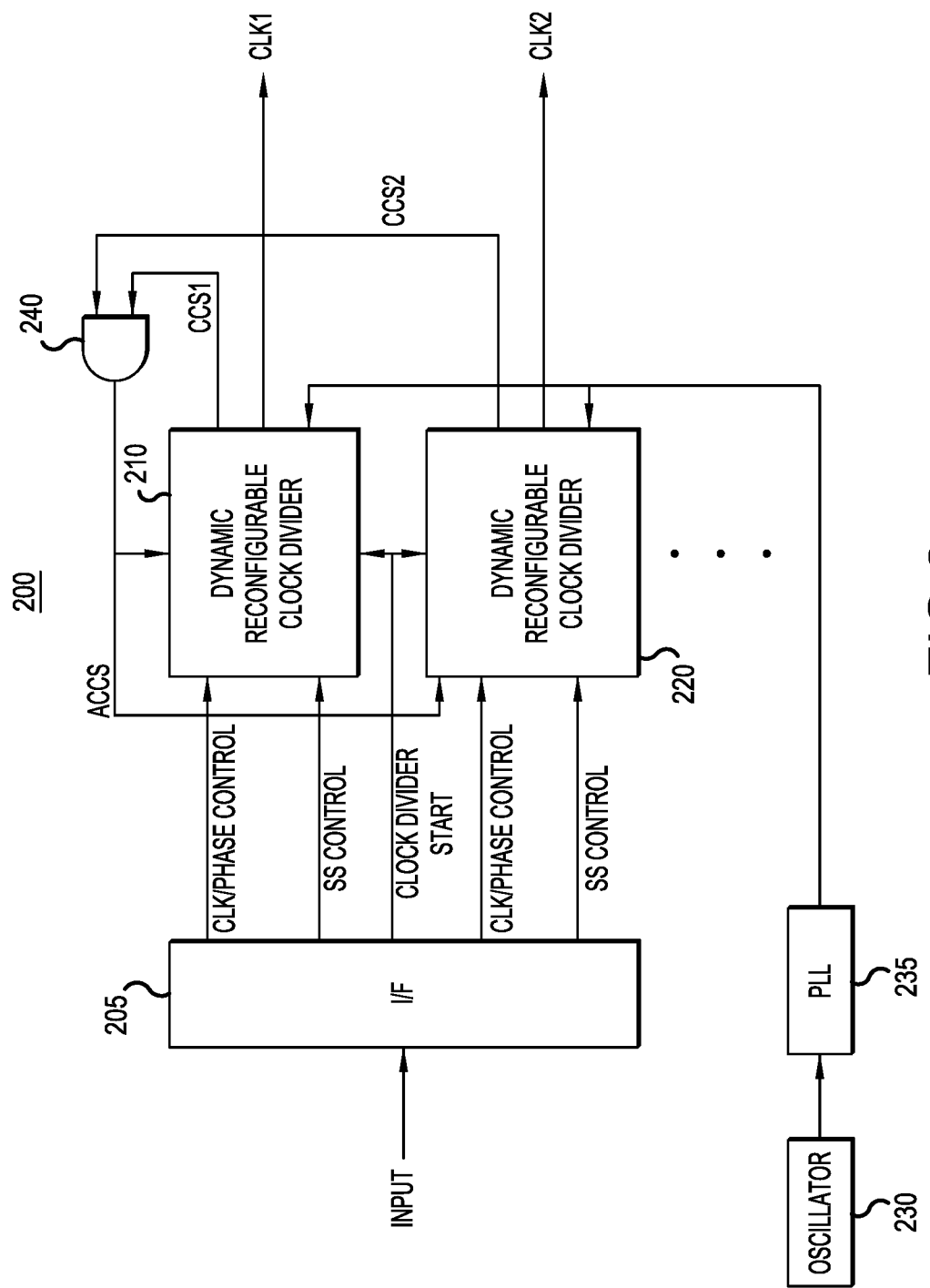
FIG. 2 is a simplified block diagram showing a clock system for dynamically reconfiguring multiple clock output signals, without clock loss and without glitches, according to a representative embodiment.

FIG. 2 is a simplified block diagram of a clock system for dynamically reconfiguring multiple clock output signals, without clock loss and without glitches, according to a representative embodiment.

Referring to FIG. 2, a clock system 200 includes an interface 205 and multiple dynamic reconfigurable clock dividers, indicated by representative first dynamic reconfigurable clock divider 210 and second dynamic reconfigurable clock divider 220, for dynamically reconfiguring corresponding clock output signals in response to clock/phase control commands, spread spectrum control commands, and a clock divider start command received from the interface 205 in response to user input. The clock system 200 may include additional dynamic reconfigurable clock dividers, indicated by the ellipsis in FIG. 2, without departing from the scope of the present teachings. The first and second dynamic reconfigurable clock dividers 210 and 220 receive dedicated clock/phase control commands and spread spectrum control commands, respectively, but receive the same clock divider start command in order to either start or reconfigure simultaneously respective counting operations, as discussed below. The dynamic reconfigurable clock dividers, including the first and second dynamic reconfigurable clock dividers 210 and 220, are duplicated modularly to run in parallel to control the respective clock output signals.

The interface 205 is a register map interface that may be configured to receive and map all or part of the clock/phase control commands, the spread spectrum control commands, and/or the clock divider start command in response to input by a user, e.g., using a graphical user interface (GUI), to the first and second dynamic reconfigurable clock dividers 210 and 220. Alternatively, or in addition, the interface 205 may be configured to receive all or part of the clock/phase control commands, the spread spectrum control commands, and/or the clock divider start command in response to input from other hardware devices or firmware, such as a Joint Test Action Group (JTAG) interface, for example.

More particularly, the first dynamic reconfigurable clock divider 210 is configured to output a first clock output signal (Clock1), which has multiple first periodic cycles at a first frequency and a first phase, in response to first clock/phase control commands and the clock divider start command received from the interface 205. The first dynamic reconfigurable clock divider 210 also outputs a first cycle complete signal (CCS1) upon completion of the current first periodic cycle of the multiple first periodic cycles and upon reconfiguring or disabling the first clock output. In addition, the first dynamic reconfigurable clock divider 210 may implement spread spectrum modulation of the first clock output signal in response to first spread spectrum control commands received from the interface 205 to output a first spread spectrum clock output signal.

Spread spectrum modulation refers to repeatedly transitioning between a base frequency of a clock output signal and a decremented frequency, indicated by the spread spectrum control commands, where the decremented frequency is marginally less than the base frequency. A spread spectrum clock output signal therefore includes transitions between frequency decrements from the base frequency by an amount in a predetermined spread frequency resolution and frequency increments back to the base frequency by the same amount, occurring in each time period of the modulation cycle. The spread spectrum modulation reduces the noise level of the clock output signal, as compared to the clock output signal without spread spectrum modulation. The functionality of the first dynamic reconfigurable clock divider 210 is described in more detail with reference to FIG. 3, below.

The second dynamic reconfigurable clock divider 220 is configured to output a second clock output signal (Clock2), which has multiple second periodic cycles at a second frequency and a second phase, in response to second clock/phase control commands and the clock divider start command received from the interface 205. The second dynamic reconfigurable clock divider 220 outputs a second cycle complete signal (CCS2) upon completion of the current second periodic cycle of the multiple second periodic cycles and upon reconfiguring or disabling the second clock output. In addition, the second dynamic reconfigurable clock divider 220 may implement spread spectrum modulation of the second clock output signal in response to second spread spectrum control commands received from the interface 205 to output a second spread spectrum clock output signal.

The clock system 200 further includes an oscillator 230 and a phase-locked loop (PLL) circuit 235 for providing a clock input signal at an input frequency to the first and second dynamic reconfigurable clock dividers 210 and 220. The oscillator 230 generates a clock signal at a predetermined frequency (e.g., 100 MHz), and the PLL circuit 235 provides feedback for locking the phase of the clock signal.

In addition, the clock system 200 includes an AND logic gate 240 configured to output an aggregated cycle complete signal (ACCS) in response to receiving the cycle complete signals from all of the dynamic reconfigurable clock dividers following the command to reconfigure the first and second clock output signals, including the first and second cycle complete signals from the first and second dynamic reconfigurable clock dividers. For example, assuming that each cycle complete signal has a value of 0 during a periodic cycle of the corresponding clock output signal, and a value of 1 upon completion of the periodic cycle but before the beginning a subsequent periodic cycle, the value of the aggregated cycle complete signal output by the AND logic gate 240 is 0 when any one of the dynamic reconfigurable clock dividers has not completed its current periodic cycle, and is 1 when all of the dynamic reconfigurable clock dividers have completed their current periodic cycle but have not yet started their subsequent periodic cycles. The aggregated cycle complete signal output by the AND logic gate 240 is input to each of the dynamic reconfigurable clock dividers.

In the depicted embodiment, the interface 205 is configured to provide reconfiguration commands to the first dynamic reconfigurable clock divider 210 in response to input changing the first frequency and/or the first phase of the first clock output signal, and/or to provide reconfiguration commands to the second dynamic reconfigurable clock divider 220 in response to input changing the second frequency and/or the second phase of the second clock output signal, for example. The reconfiguration commands provide information regarding reconfiguring the first and second clock output signals. After the first dynamic reconfigurable clock divider 210 receives the reconfiguration commands, it maintains the first frequency and the first phase of the first clock output signal until it completes the current first periodic cycle (and thus sends out the first cycle complete signal) and receives the aggregated cycle complete signal from the AND logic gate 240. The first dynamic reconfigurable clock divider 210 then implements the changed first frequency and/or the changed first phase. Likewise, after the second dynamic reconfigurable clock divider 220 receives the reconfiguration commands, it maintains the second frequency and the second phase of the second clock output signal until it completes the current second periodic cycle (and thus sends out the second cycle complete signal) and receives the aggregated cycle complete signal from the AND logic gate 240. The second dynamic reconfigurable clock divider 210 then implements the changed second frequency and/or the changed second phase.

In an embodiment, the interface 205, the first and second dynamic reconfigurable clock dividers 210 and 220, the PLL circuit 235 and the AND logic gate 240 may be included in a field programmable gate array (FPGA), for example. However, in alternative embodiments, the respective functionalities may be implemented by alternative means, without departing from the scope of the present teachings. For example, one or more of the interface 205, the first and second dynamic reconfigurable clock dividers 210 and 220, the PLL circuit 235 and the AND logic gate 240 may be implemented by a processing unit, such as processing unit 910 discussed below with reference to FIG. 9, which may include one or more servers, general purpose computers, central processing units, processors, microprocessors or microcontrollers, state machines, programmable logic devices, application specific integrated circuits (ASICs), as well as FPGAs, or combinations thereof, using any combination of hardware, software, firmware, hard-wired logic circuits, or combinations thereof.

Figure 3:
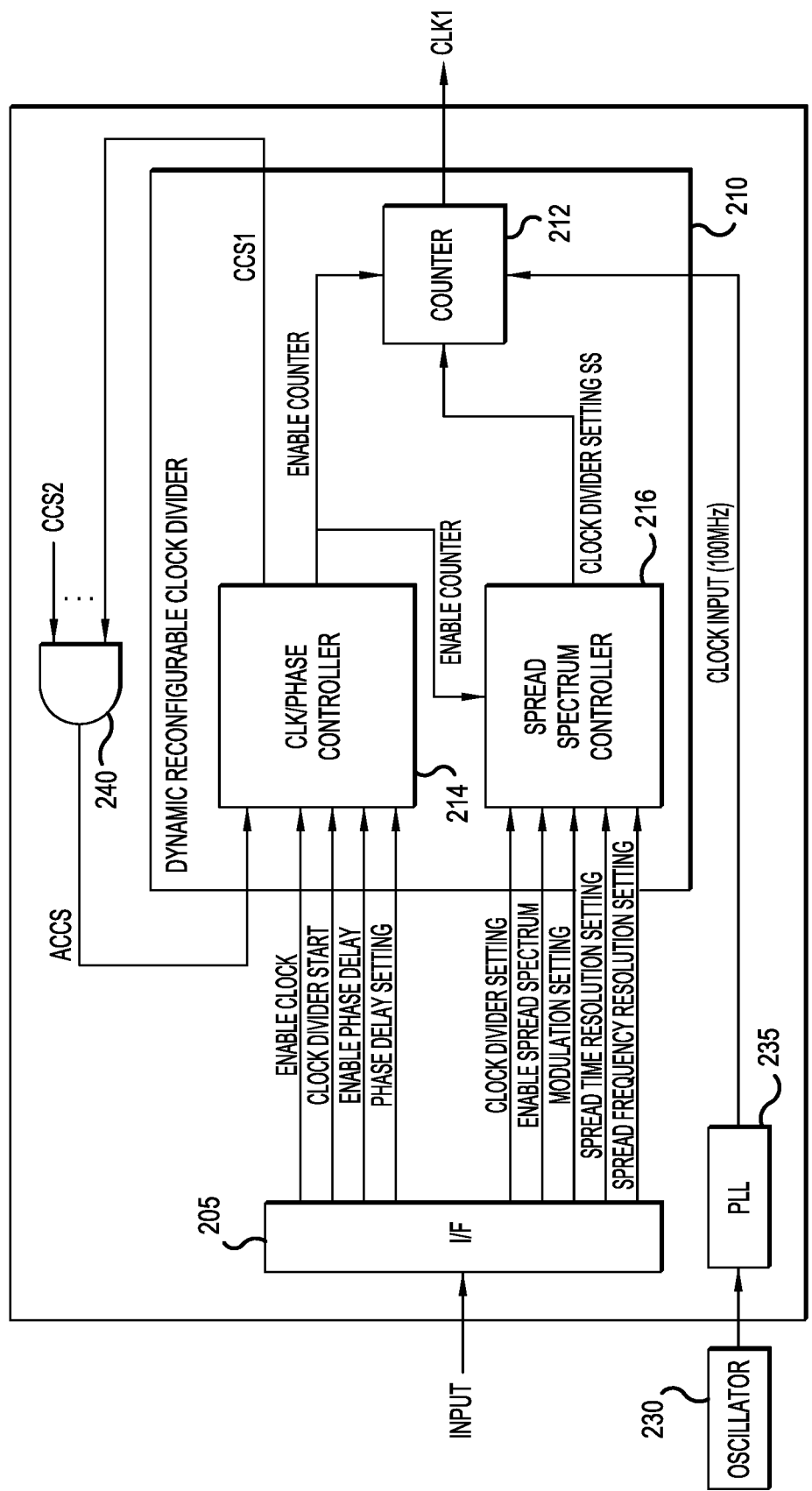
FIG. 3 is a simplified block diagram showing a dynamic reconfigurable clock divider for the clock system in FIG. 1 for dynamically reconfiguring multiple clock output signals, without clock loss and without glitches, according to a representative embodiment.

FIG. 3 is a simplified block diagram showing a dynamic reconfigurable clock divider of the clock system in FIG. 2 for dynamically reconfiguring multiple clock output signals, without clock loss and without glitches, according to a representative embodiment.

Referring to FIG. 3, the first dynamic reconfigurable clock divider 210 includes a first counter 212, a first clock/phase controller 214, and a first spread spectrum controller 216. It is understood that the second dynamic reconfigurable clock divider 220 would similarly include a second counter, a second clock/phase controller, and a second spread spectrum controller identical to the first counter 212, the first clock/phase controller 214, and the first spread spectrum controller 216, although they are not shown for the sake of convenience.

The first counter 212 receives the input clock signal from the PLL circuit 235, and performs a first counting operation to output the first clock output signal (CLK1) having a first frequency. In particular, the first counter 212 acts as a frequency divider, dividing the input frequency of the clock input signal into the desired frequency of the first clock output signal. That is, the first counter 212 may divide the input frequency of the clock input signal by a clock divider setting to output the first clock output signal at the first frequency. The first counter 212 is triggered to begin the first counting operation by an enable counter signal received from the first clock/phase controller 214, which generates the enable counter signal in response to receiving a clock divider start command and the aggregated cycle complete signal (ACCS), discussed above. Therefore, in the case of reconfiguration, the first clock/phase controller 214 generates the enable counter signal only when it receives the aggregated cycle complete signal after receiving the clock divider start command, indicating that all of the dynamic reconfigurable clock dividers in the clock system 200, including the first dynamic reconfigurable clock divider 210 itself, have ended their current periodic cycles of the corresponding clock output signals and have not yet begun their subsequent periodic cycles.

The first clock/phase controller 214 receives the clock/phase control commands from the interface 205. The clock/phase control commands include the clock divider start command, an enable clock command, the clock divider setting, an enable phase delay command, and a phase delay setting. The clock divider start command initiates the start of a particular configuration or reconfiguration of the first clock output signal including the first frequency and/or the first phase. The clock divider start command is also received by clock/phase controllers in the other dynamic reconfigurable clock dividers in the clock system 200, including the second dynamic reconfigurable clock divider 220, at the same time to initiate corresponding output clock signal reconfigurations. The clock divider setting provides a value by which the input frequency of the clock input signal is to be divided to obtain the first frequency of the first clock output signal, and the enable clock command enables the configuration or reconfiguration of the first counter 212 to generate the first clock output signal with the first frequency in accordance with the clock divider setting. For example, the first counter 212 may toggle the first clock output signal whenever it counts up to the clock divider setting before wrapping around to zero to start the counting operation again. Since each clock/phase controller receives a dedicated enable clock command, the clock system 200 has flexibility to disable one or more output clock signal(s) that do not receive respective enable clock command(s) in other dynamic reconfigurable clock dividers, while enabling reconfiguration of the first clock output signal. For example, when the enable clock command is set to 0, the corresponding clock output signal is disabled.

Assuming the first counter 212 is already outputting the first clock output signal, the clock divider start command initiates reconfiguration of the first counter 212 to output a different first frequency in accordance with a new clock divider setting, only after the first clock/phase controller 214 has completed the current first periodic cycle and has received the aggregated cycle complete signal. The first clock/phase controller 214 may determine when the current first periodic cycle completes by sampling whether the first counter 212 has wrapped or not. That is, when the counting operation by the first counter 212 has wrapped to zero, it means that the first periodic clock cycle is completed. In an embodiment, when spread spectrum modulation of the first clock output signal is desired, the clock divider setting is provided to the first spread spectrum controller 216, in addition to or instead of the first counter 212.

The phase delay setting provides a value for setting a phase offset or phase angle of the first phase of the first clock output signal, and the enable phase delay command enables the configuration or reconfiguration of the first counter 212 with regard to generate the first clock output signal with the first phase in accordance with the phase delay setting when receiving the clock divider start command. For example, the first clock/phase controller 214 may include a delay setting counter that is incremented by an amount corresponding to the desired phase delay, which is used by the first counter 212 to generate the required phase delay of the first clock output signal. Similar to enable clock command, each dynamic reconfigurable clock divider, including the first and second dynamic reconfigurable clock dividers 210 and 220, has an individual enable phase command. Therefore, the clock divider start command still initiates the reconfiguration (for frequency and/or phase), while the respective individual enable phase commands determine whether to allow the phase delay setting to apply in the new reconfiguration. Assuming the first counter 212 is already outputting the first clock output signal, the clock divider start command initiates reconfiguration of the first counter 212 to output a different first phase in accordance with a new phase delay setting and in conjunction with the enable phase delay command being received concurrently with the clock divider start command by the clock/phase controller 214, only after the first clock/phase controller 214 has completed the current first periodic cycle and has received the aggregated cycle complete signal.

In addition, the first clock/phase controller 214 outputs the first cycle complete signal to the AND logic gate 240 upon completion of the current first periodic cycle of the first clock output signal and upon either receiving the clock divider start command to reconfigure the frequency and/or phase of the first clock output or receiving the enable clock command being set to 0.

The first spread spectrum controller 216 receives the spread spectrum control commands from the interface 205, as well as the enable counter command output by the first clock/phase controller 214. The spread spectrum control commands include the clock divider setting, an enable spread spectrum command, a spread modulation setting, a spread time resolution setting, and a spread frequency resolution setting. As discussed above, the clock divider setting provides the value by which the input frequency of the clock input signal is to be divided to obtain the first frequency of the first clock output signal, effectively identifying the first frequency that is subjected to the spread spectrum modulation. The enable spread spectrum command initiates the spread spectrum modulation implementation. The spread modulation setting sets a time period of each modulation cycle in the spread spectrum modulation. The spread time resolution setting sets a time of each frequency decrement and each frequency increment within each time period of the modulation cycle. The spread frequency resolution setting sets an amount of each frequency decrement and each subsequent frequency increment relative to a base frequency (e.g., the first frequency) per each spread time resolution of the first clock output signal within each time period of the modulation cycle.

The first spread spectrum controller 216 outputs a spread spectrum clock divider setting to the first counter 212 indicating the spread modulation, the spread time resolution, and the spread frequency resolution as defined by the spread spectrum control commands. In response, the first counter 212 outputs the first clock output signal with the spread spectrum modulation, which may be referred to as a spread spectrum first clock output signal. Thus, the first frequency of the spread spectrum first clock output signal includes transitions between frequency decrements from the first frequency by the amount of the frequency decrement in the spread frequency resolution and frequency increments back to the first frequency by the amount of the frequency increment in the spread frequency resolution, for each spread time resolution occurring in the time period of the modulation cycle.

The spread spectrum modulation of the spread spectrum first clock output signal may likewise be reconfigured on-the-fly, like the first frequency and/or first phase. That is, the first spread spectrum controller 216 may receive at least one reconfiguration command changing at least one of the spread modulation, the spread time resolution, and the first spread frequency resolution. In response, the first spread spectrum controller 216 maintains the current spread modulation, spread time resolution, and spread frequency resolution until the current first periodic cycle of the multiple first periodic cycles is complete, as indicated by the first cycle complete signal, and the aggregated cycle complete signal is received by the first clock/phase controller 214. Then, the first spread spectrum controller 216 implements the changed the at least one of the spread modulation, the spread time resolution, or the spread frequency resolution.

Figure 4:
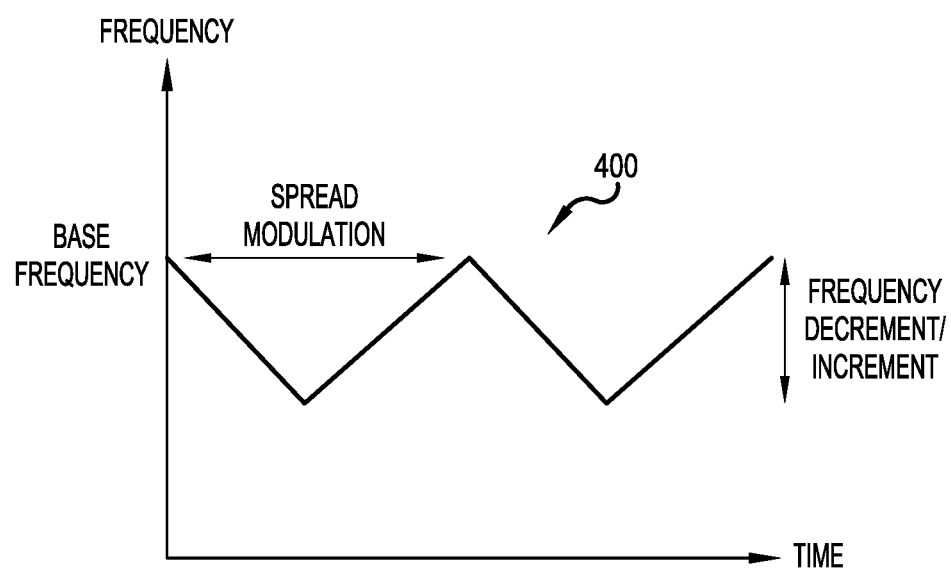
FIG. 4 is a trace showing spread spectrum modulation, according to a representative embodiment.

FIG. 4 is a trace showing spread spectrum modulation, according to a representative embodiment. Referring to FIG. 4, first clock output signal 400 has a base frequency (e.g., 50 MHz) that is subject to spread spectrum modulation. As discussed above, the spread modulation of the first clock output signal 400 is the time period of each modulation cycle, defined by a frequency decrement (e.g., 0.2 MHz) from the base frequency followed by a frequency increment back to the base frequency.

Figure 5A:
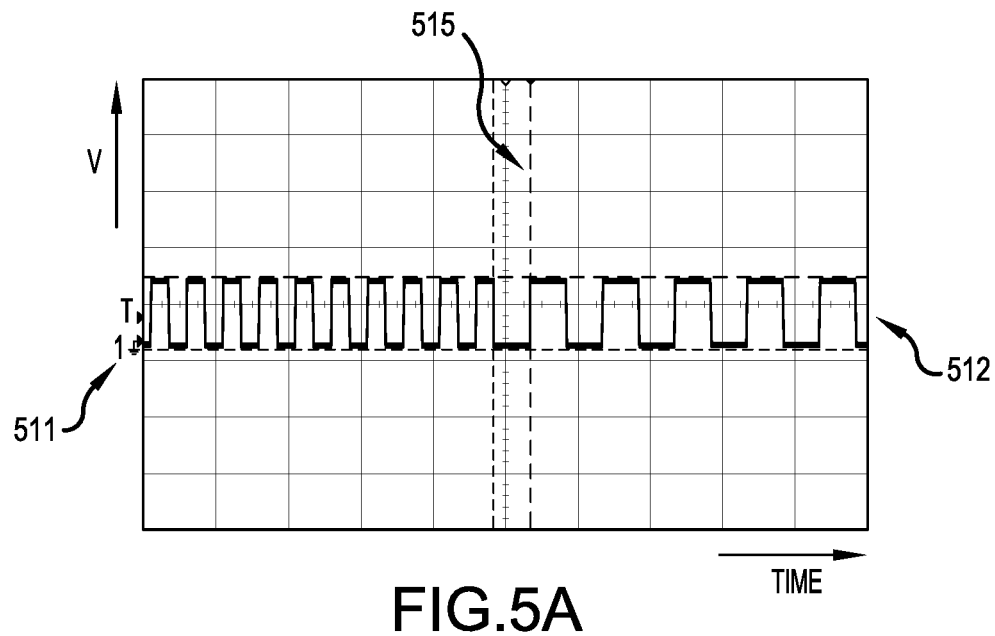
FIG. 5A is a trace showing an example of dynamically reconfiguring frequency of the first clock output signal on-the-fly, without clock loss and without glitches, according to a representative embodiment.
Figure 5B:
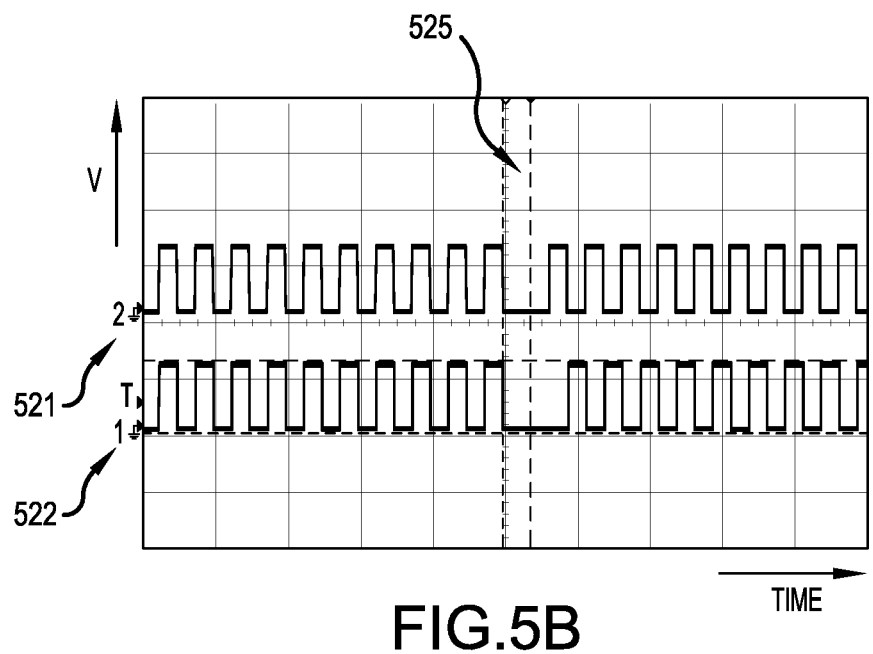
FIG. 5B is a trace showing an example of dynamically reconfiguring phase of the first clock output signal on-the-fly, without clock loss and without glitches, according to a representative embodiment.

FIG. 5A is a trace showing an example of dynamically reconfiguring frequency of the first clock output signal on-the-fly, without clock loss and without glitches, according to a representative embodiment, and FIG. 5B is a trace showing an example of dynamically reconfiguring phase of the first clock output signal on-the-fly, without clock loss and without glitches, according to a representative embodiment.

Figure 1B:
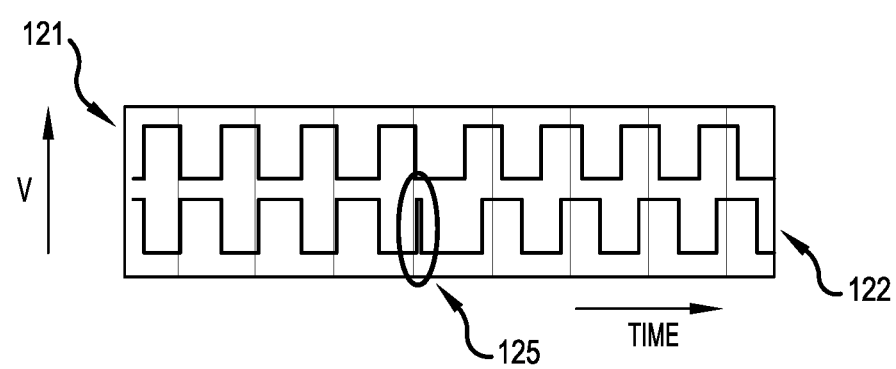
FIG. 1B shows a glitch in an illustrative clock signal reconfigured on-the-fly using conventional reconfiguration.

Referring to FIG. 5A, first clock output signal 511 having an original first frequency (e.g., 10 MHz) is reconfigured on-the-fly to new first clock output signal 512 having a different first frequency (e.g., 5 MHz) in response to a new clock divider (frequency) setting. During transition period 515, there is no clock loss as shown in FIG. 1A, and no glitch as shown in FIG. 1B. Likewise, referring to FIG. 5B, first clock output signal 521 and the second clock output signal 522 having an original first phase and second phase respectively (e.g., 0 degrees) are reconfigured on-the-fly to new second clock output signal 522 having a different second phase (e.g., 180 degrees) with respect to new first clock output signal 521 in response to a new phase delay setting. During a transition period 525, there is no clock loss and no glitch. Although depicted separately, the new first frequency and the new first phase may be implemented simultaneously.

In various embodiments, the functions of the first and second dynamic reconfigurable clock dividers 210 and 220 may be implemented according to finite state machines. In this regard, FIG. 6 shows a finite state machine of a clock/phase controller for controlling synchronization and phase of an output clock signal, according to a representative embodiment, and FIG. 7 shows a finite state machine of a spread spectrum controller for controlling spread spectrum modulation of an output clock signal, according to a representative embodiment.

Figure 6:
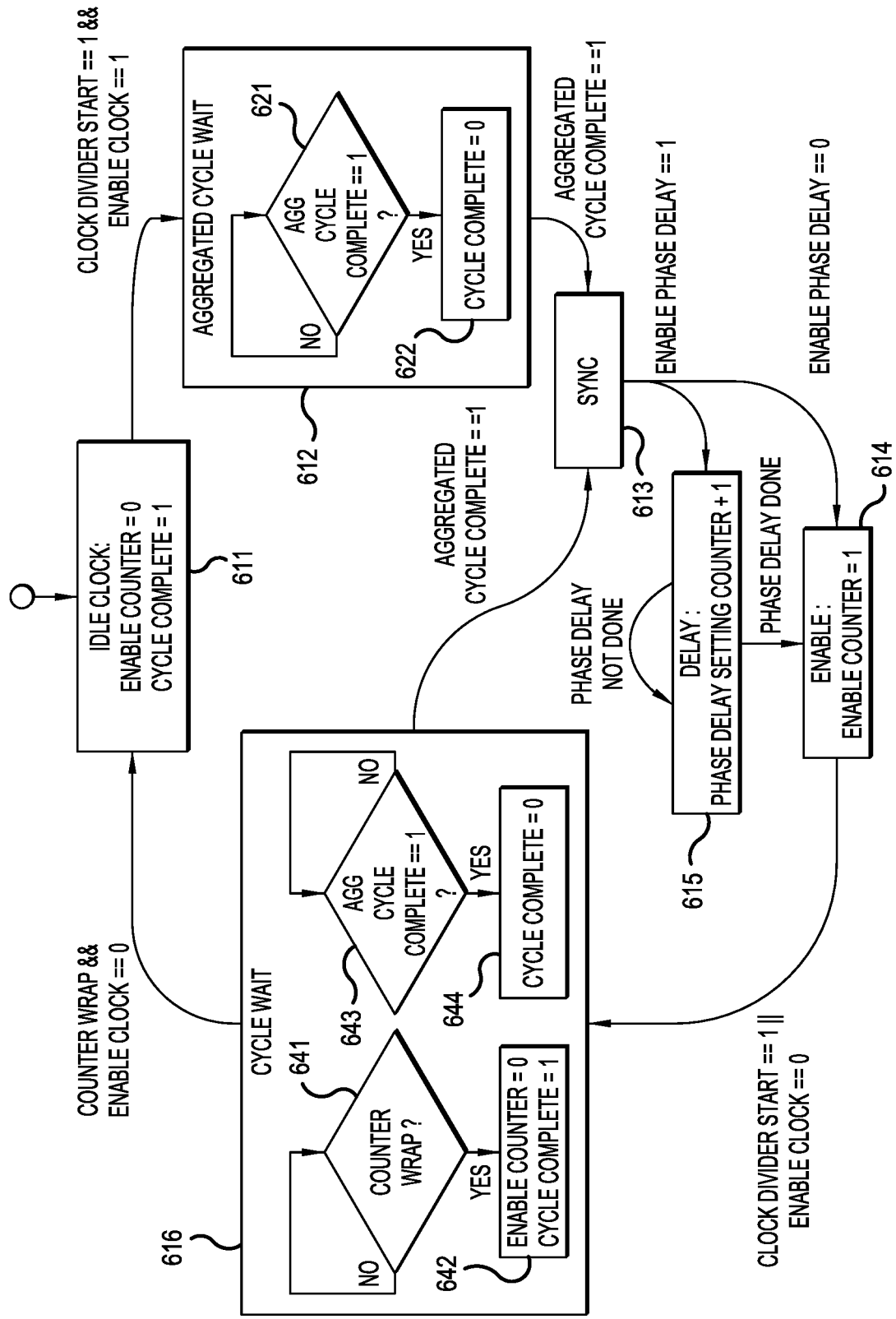
FIG. 6 shows a finite state machine of a clock/phase controller for controlling synchronization and phase of an output clock signal, according to a representative embodiment.
Figure 7:
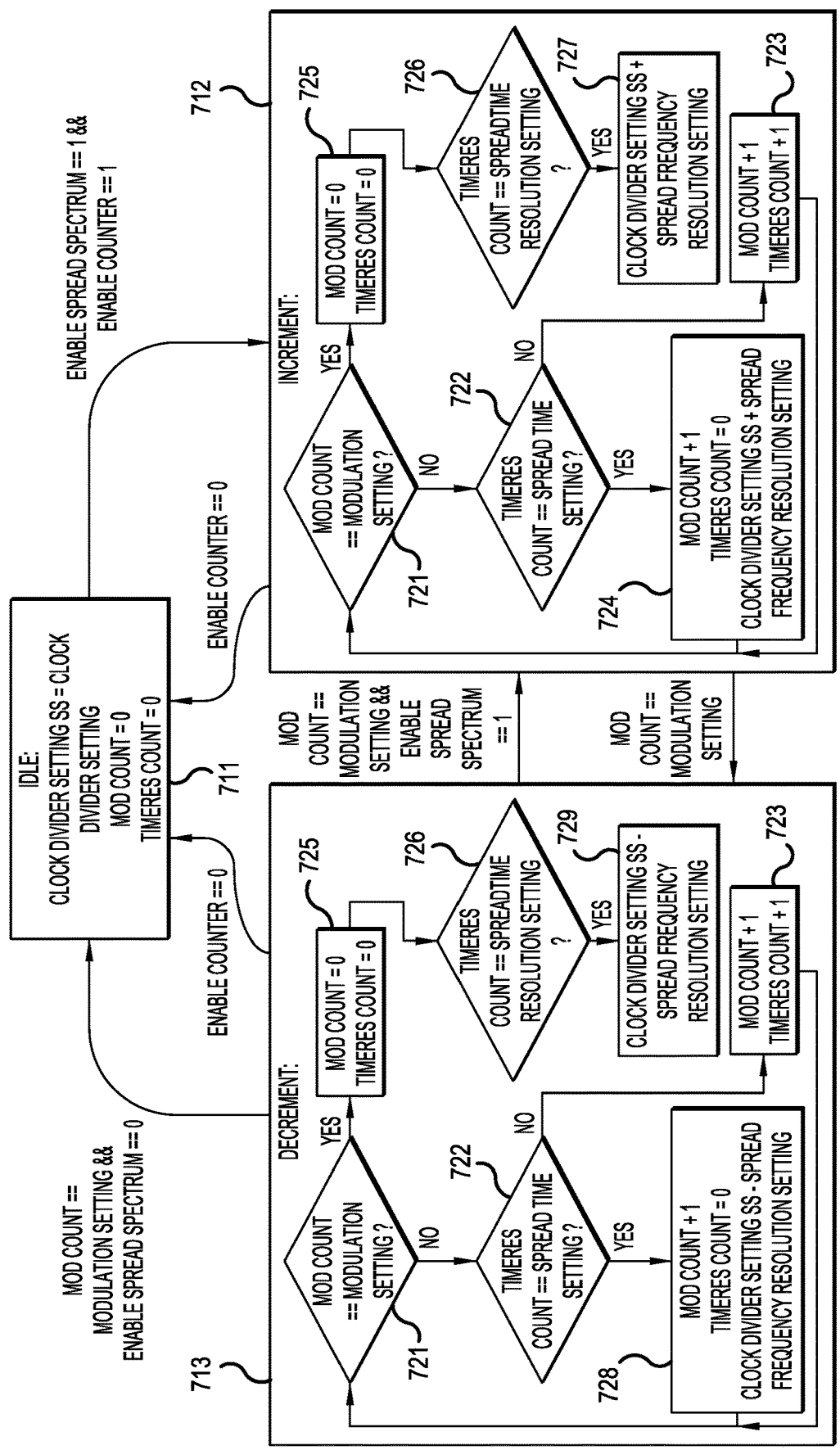
FIG. 7 shows a finite state machine of a spread spectrum controller for controlling spread spectrum modulation of an output clock signal, according to a representative embodiment.

Referring to FIG. 6, the clock/phase controller (e.g., first clock/phase controller 214) begins in idle state 611, in which the enable counter signal is 0 and the cycle complete signal (e.g., first cycle complete signal) for the clock/phase controller is 1. In response to each of the clock divider start signal and the enable clock signal being set to 1, the state machine advances to aggregated cycle wait state 612, in which the state machine waits for receipt of the aggregated cycle complete signal, e.g., from the AND logic gate 240, indicating that each of the dynamic reconfigurable clock dividers in the system has completed outputting the current cycle of its clock output signal. The aggregated cycle wait state 612 includes a function that determines whether the aggregated cycle complete signal is equal to 1 according to a continuous loop in block 621, and sets the cycle complete signal of the clock/phase controller to 0 in block 622 once the aggregated cycle complete signal is determined to equal 1.

The state machine advances to synchronizing state 613 upon receiving the aggregated cycle complete signal equal to 1 from the aggregated cycle wait state 612 or from cycle wait state 616, discussed below. The synchronizing state 613 synchronizes phase offset of the clock output signal when needed as indicated by the enable phase delay signal. When the enable phase delay signal is set to 0, indicating no phase offset, the state machine advances directly to enable counter state 614, in which the enable counter signal is activated by setting the enable counter signal to 1 and provided to the counter (e.g., first counter 212) of the dynamic reconfigurable clock divider. However, when the enable phase delay signal is set to 1, indicating phase offset, the state machine advances to phase delay state 615, which executes a loop for a time corresponding to the phase delay in accordance with the phase delay setting. That is, a phase delay setting counter is incremented by 1 for each iteration of the loop occurring during the time. The state machine advances from the phase delay state 615 to the enable counter state 614 upon completion of the phase delay, which sets the enable counter signal to 1.

In response to the pulsed clock divider start command being 1 or the enable clock signal being set to 0, the state machine advances to the cycle wait state 616, in which the state machine waits for receipt of both the completion of the counter wrapping to zero indicating that the clock/phase controller itself has completed the current cycle of its own clock output signal and the aggregated cycle complete signal indicating that each of the dynamic reconfigurable clock dividers in the system has completed the current cycle of its clock output signal. For example, when the interface 205 is configured to send out the clock divider start command, it generates a pulse on the clock divider start command once, and then keeps it at 0 until the interface 205 is configured again to send out the next clock divider start command.

The cycle wait state 616 includes two functions: A first function determines whether a counter wrap has been performed by the counter according to a continuous loop in block 641, and sets the cycle complete signal of the clock/phase controller to 1 and the enable counter signal to 0 in block 642 once the counter wrap occurs. The counter wrap occurs when the counter counts up to the clock divider setting, as discussed above. A second function determines whether the aggregated cycle complete signal is equal to 1 according to a continuous loop in block 643, and sets the cycle complete signal of the clock/phase controller to 0 in block 644 once the aggregated cycle complete signal equals 1.

From the cycle wait state 616, the state machine may either advance back to the idle state 611 or to the synchronizing state 613. Whether the state machine advances to the idle state 611 or the synchronizing state 613 depends on whether the user wants to reconfigure the clock frequency and/or phase of the clock output signal or wants to disable the clock output signal entirely. When it is determined that the counter wrap has been performed and the enable clock signal is set to 0, the cycle wait state 616 sets the cycle complete signal to 1 and sets the enable counter signal to 0, and the state machine advances back to the idle state 611. When it is determined that the aggregated cycle complete signal is equal to 1, the state machine advances back to the synchronizing state 613, which synchronizes phase offset of the clock output signal when needed as indicated by the enable phase delay signal.

More particularly, back in the enable counter state 614, the state machine will transition to the cycle wait state 616 when the state machine either receives the clock divider start command set to 1 or the enable clock command set to 0. When the enable clock command equals 0 as received at the enable counter state 614 (without the clock divider start command), it means the user wants to disable the clock output signal. So, after transitioning to the cycle wait state 616, the state machine just processes blocks 641 and 642 and transitions to the idle state 611, in which the clock output signal is disabled. The clock output signal remains disabled until it is reenabled. In this case, the cycle wait state 616 does not need to process blocks 643 and 644, and does not need to wait for the aggregated cycle complete signal to transition to the idle state 611 because a disabled clock output signal is not going to be reconfigured.

When the clock divider start command is received (while the enable clock signal is still 1) at the enable counter state 614, it means the user wants to reconfigure the clock output signal while keeping the clock system running. Therefore, the state machine transitions to the cycle wait state 616, in which blocks 641 and 642 are processed, as well as blocks 643 and 644 to wait for the aggregated cycle complete signal. The aggregated cycle complete signal is the same signal from AND logic gate 240 that is being sampled by both the cycle wait state 616 and the aggregated cycle wait state 612. However, there is a possibility that the aggregated cycle complete signal has already changed logic due to other cycle complete signals from other dynamic reconfigurable clock dividers when the states transition from the aggregated cycle wait state 612 until the cycle wait state 616. So, at the cycle wait state 616, the aggregated cycle complete signal is resampled.

Referring to FIG. 7, the finite state machine enables the spread spectrum controller to down spread modulation with the modulation frequency and is able to be dynamically reconfigured. The spread spectrum controller (e.g., first spread spectrum controller 216) begins in idle state 711, in which the spread spectrum clock divider setting SS is set to equal the clock divider setting provided to the clock/phase controller, a modulation count of the modulation setting is set to 0, and a time resolution count of the spread time resolution setting is set to 0. In response to the enable spread spectrum signal being set to 1 and the enable counter signal output by the clock/phase controller equaling 1, the state machine enters a loop between increment state 712 and decrement state 713. The increment state 712 provides frequency decrements of the modulation by incrementing the spread spectrum clock divider setting and the decrement state 713 provides frequency increments by decrementing the spread spectrum clock divider setting of the modulation. The increment state 712 and the decrement state 713 work in tandem to execute the function of controlling the amount of spread modulation and frequency increment and decrement of the clock output by incrementing and decrementing the spread spectrum clock divider setting, which is then sent to the counter (e.g., first counter 212).

The modulation count is for counting the spread modulation. The modulation count counts up to the modulation setting in the increment state 712, wraps to zero, and after transitioning to the decrement state 713, counts up to the modulation setting again. The time resolution count is for counting the spread time resolution. In the increment state 712 and the decrement state 713, the spread time resolution count will count up to the spread time resolution setting, and upon wrapping to zero, the spread time resolution count will increment/decrement the spread spectrum clock divider setting by an amount specified by the spread frequency resolution.

Referring to the increment state 712, it is determined in block 721 whether the modulation count is equal to the modulation setting input to the spread spectrum controller. When the modulation count is not equal to the modulation setting (block 721: No), it is determined in block 722 whether the time resolution count is equal to the spread time resolution setting input to the spread spectrum controller. When the time resolution count is not equal to the spread time resolution setting (block 722: No), each of the modulation count and the spread time resolution count is incremented by 1 in block 723, and the process returns to block 721. When the time resolution count is equal to the spread time resolution setting (block 722: Yes), the modulation count is incremented by 1, the time resolution count is set to 0, and the spread spectrum clock divider setting is increased by the spread frequency resolution setting in block 724, and the process returns to block 721.

Returning to block 721, when the modulation count is equal to the modulation setting (block 721: Yes), each of the modulation count and the time resolution count is set to 0 in block 725. Then, in block 726, it is determined whether the time resolution count is equal to the spread time resolution setting input to the spread spectrum controller. When the time resolution count is equal to the spread time resolution setting (block 726: Yes), the spread spectrum clock divider setting is increased by the spread frequency resolution setting in block 727. Since the modulation count is equal to the modulation setting, as indicated by block 721, which is also the same requirement to transition to the decrement state 713, the increment state 712 transitions to the decrement state 713 after performing blocks 725, 726 and 727, with block 726 being Yes. Referring again to block S726, when the time resolution count does not equal to the spread time resolution setting (block 726: No), the increment state 712 takes no action.

When the modulation count is equal to the modulation setting, the state machine advances to the decrement state 713, which executes substantially the same function described above with reference to the increment state 712 with the exception of blocks 728 and 729 where the spread spectrum clock divider setting is decreased by the spread frequency resolution setting instead of increased, as in blocks 724 and 727 in the increment state 712. Then, again, when the modulation count is equal to the modulation setting, and the enable spread spectrum command is set to 1, the state machine returns to the increment state 712. Also, the state machine advances from the decrement state 713 to the idle state 711 when the modulation count is equal to the modulation setting and the enable spread spectrum command is set to 0. Also, both the increment state 712 and decrement state 713 can advance back to the idle state 711 when the enable counter signal received from the clock/phase controller (e.g., first clock/phase controller 214) is 0.

Since the clock/phase controller controls the enable counter command, the spread spectrum controller receives the enable counter command from the clock/phase controller to know if the clock/phase controller has disabled the counter. If the counter is disabled, then the spread spectrum controller returns to the idle state 711 to stop the spread spectrum operation until the next time new enable counter and enable spread spectrum commands are received. This also applies to reconfiguration when in the cycle wait state 616 of the clock/phase controller, the enable counter signal is set to 0 at the same time the cycle complete is set to 1. This indicates to the spread spectrum controller that reconfiguration is happening, and the spread spectrum controller returns to the idle state 711 to receive the new spread spectrum command.

Figure 8:
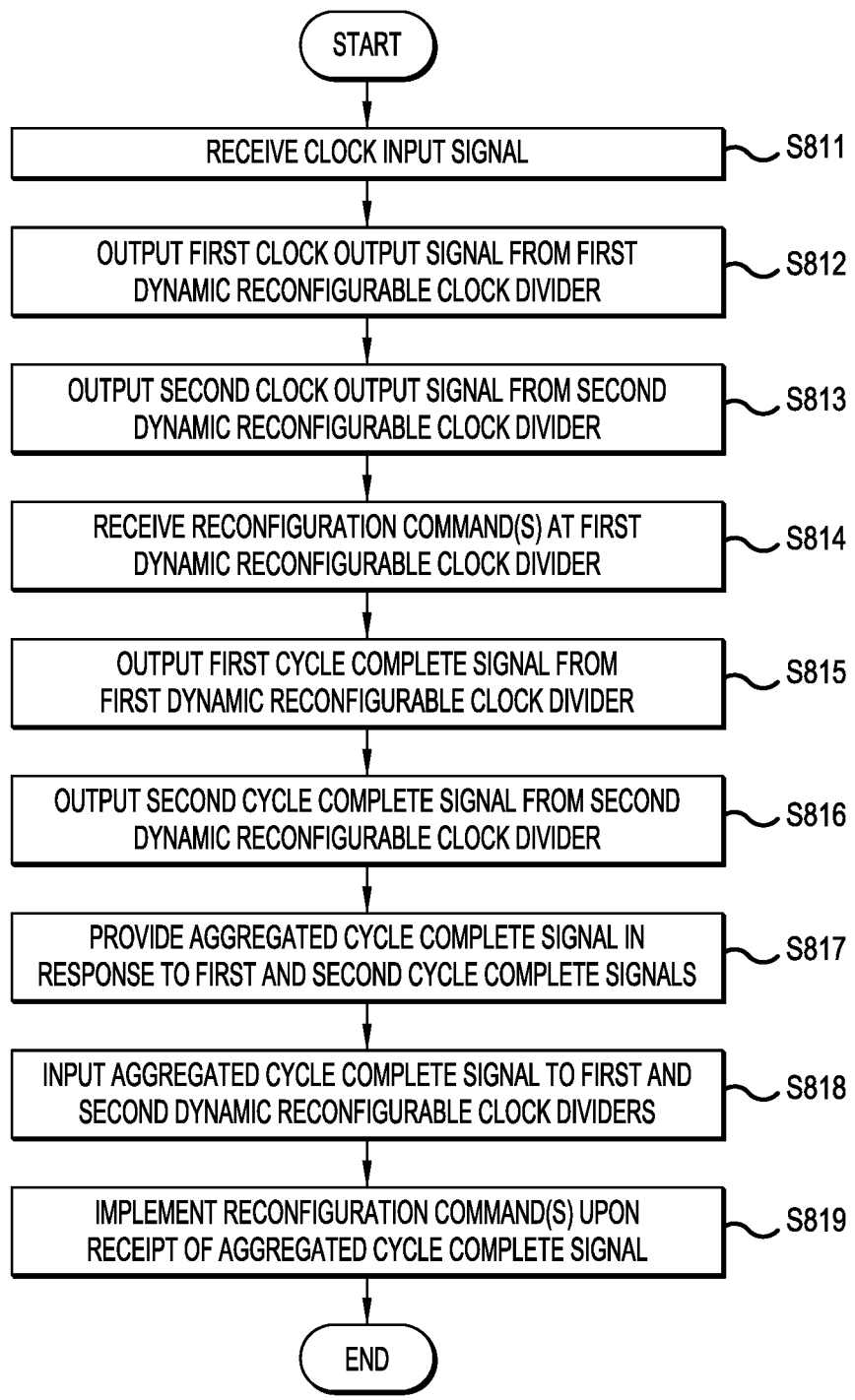
FIG. 8 is a flow diagram showing a method of dynamically reconfiguring a plurality of clock output signals, without clock loss and without glitches, according to a representative embodiment.

FIG. 8 is a flow diagram showing a method of dynamically reconfiguring multiple clock output signals, without clock loss and without glitches, according to a representative embodiment. The clock output signals are output by respective dynamic reconfigurable clock dividers, such as the first and second dynamic reconfigurable clock dividers 210 and 220, discussed above.

Referring to FIG. 8, a clock input signal is received in block S811. The clock input signal may be generated by an oscillator (e.g., oscillator 230) and phase locked by a PLL operating on the signal output by the oscillator (e.g., PLL circuit 235).

In block S812, a first clock output signal is output from a first dynamic reconfigurable clock divider (e.g., first dynamic reconfigurable clock divider 210). The first clock output signal includes first periodic cycles at a first frequency and a first phase. The first frequency may be generated in response to a first counting operation on the clock input signal by a first counter (e.g., first counter 212), and the first phase may be generated by the first clock/phase controller (e.g., first clock/phase controller 214) in response to a first phase delay setting counter, discussed above with reference to FIG. 6. The first counting operation may include dividing an input frequency of the clock input signal by a first clock divider setting to obtain the first frequency. In block S813, a second clock output signal is output from a second dynamic reconfigurable clock divider (e.g., second dynamic reconfigurable clock divider 220). The second clock output signal includes second periodic cycles at a second frequency and a second phase. The second frequency may be generated in response to a second counting operation on the clock input signal, and the second phase may be generated by a second clock/phase controller in response to a second phase delay setting counter. The second counting operation may include dividing the input frequency of the clock input signal by a second clock divider setting to obtain the second frequency.

In block S814, at least one first reconfiguration command is received at the first dynamic reconfigurable clock divider. The at least one first reconfiguration command changes at least one of the first frequency or the first phase of the first clock output signal, and/or changes at least one of spread modulation, spread time resolution or spread frequency resolution of spread spectrum modulation of the first clock output signal. At least one second reconfiguration command may also be received at the second dynamic reconfigurable clock divider to change at least one of the second frequency or the second phase of the second clock output signal, and/or to change at least one of spread modulation, spread time resolution or spread frequency resolution of spread spectrum modulation of the second clock output signal. Alternatively, the at least one first or second reconfiguration command may disable the first clock output signal and/or the second clock output signal. The first clock output signal may be reconfigured or disabled according to the embodiments herein without the second clock output signal necessarily being reconfigured or disabled. Performing spread spectrum modulation may include setting a time period of each modulation cycle in the spread spectrum modulation, setting a time resolution of each frequency increment and each frequency decrement within each time period of the modulation cycle, and setting an amount of each frequency decrement and each subsequent frequency increment relative to a base frequency per each spread time resolution of the first or second clock output signal within each time period of the modulation cycle.

In block S815, a first cycle complete signal is output from the first dynamic reconfigurable clock divider in response to completion of the current first periodic cycle of the multiple first periodic cycles after receiving the at least one reconfiguration command. Likewise, in block S816, a second cycle complete signal is output from the second dynamic reconfigurable clock divider in response to completion of the current second periodic cycle of the multiple second periodic cycles. When the second dynamic reconfigurable clock divider receives the at least one second reconfiguration command, it outputs the second cycle complete signal in response to completion of the current second periodic cycle after receiving the at least one second reconfiguration command. The values of the first and second cycle complete signal may each be changed from 0 to 1, for example, to indicate the completion of the current first and second periodic cycles.

In block S817, an aggregated cycle complete signal is provided in response to receiving both the first cycle complete signal and the second cycle complete signal. For example, the aggregated cycle complete signal may be provided in response to an AND logic operation on the first cycle complete signal and the second cycle complete signal, where the aggregated cycle complete signal is provided (equal to 1) whenever both the first and second cycle complete signals are present (also equal to 1).

In block S818, the aggregated cycle complete signal is input to the first and second dynamic reconfigurable clock dividers. The aggregated cycle complete signal indicates to the first and second dynamic reconfigurable clock dividers that all of the periodic cycles of all of the dynamic reconfigurable clock dividers in the clock system (e.g., first and second dynamic reconfigurable clock dividers in the present example) have been completed, and that corresponding subsequent periodic cycles have not yet begun. This enables reconfigurations of the dynamic reconfigurable clock dividers to take place on-the-fly, with regard to clock frequencies and/or phases of the respective clock output signals, without clock loss or glitches. This also enables reconfigurations on-the-fly with regard to application and adjustment of spread spectrum modulations, without clock loss or glitches. Also, one or more of the dynamic reconfigurable clock dividers may be disabled on-the-fly, while other dynamic reconfigurable clock dividers are reconfigured.

In block S819, in response to the at least one reconfiguration command, the first frequency and the first phase are initially maintained at their current values, and/or the spread modulation, the spread time resolution or the spread frequency resolution are initially maintained at their current values, until (i) a current first periodic cycle of the multiple first periodic cycles ends and (ii) the aggregated cycle complete signal is received. Then, upon determination of the current first periodic cycle ending and receipt of the aggregated cycle complete signal, but before the beginning of the next first periodic cycle of the multiple first periodic cycles, the changed first frequency, the changed first phase, the changed spread modulation, the changed spread time resolution and/or the changed spread frequency resolution are implemented.

Figure 9:
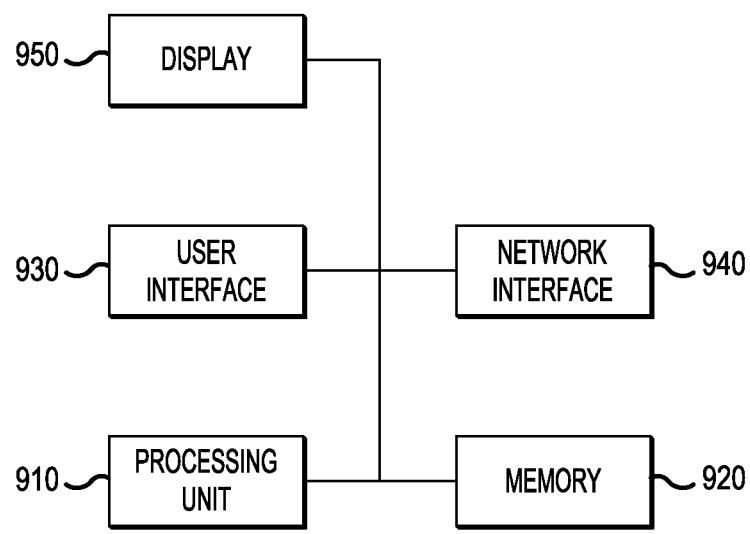
FIG. 9 is a simplified block diagram showing an illustrative implementation of the clock system, according to a representative embodiment.

FIG. 9 is a simplified block diagram showing an illustrative implementation of the clock system, according to a representative embodiment.

Referring to FIG. 9, clock system 200 includes a processing unit 910 and memory 920 for storing instructions executable by the processing unit 910 to implement the processes described herein. The clock system 200 may further include a user interface 930 for interfacing with a user, and a network interface 940 for interfacing with other components and instruments, and a display 950.

The processing unit 910 is representative of one or more processing devices, and is configured to execute software instructions to perform functions as described in the various embodiments herein. The processing unit 910 may be implemented by one or more servers, general purpose computers, central processing units, processors, microprocessors or microcontrollers, state machines, programmable logic devices, FPGAs, ASICs, or combinations thereof, using any combination of hardware, software, firmware, hard-wired logic circuits, or combinations thereof. As such, the term "processing unit" encompasses an electronic component able to execute a program or machine executable instructions, may be interpreted to include more than one processor or processing core, as in a multi-core processor and/or parallel processors. The processing unit 910 may also incorporate a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 920 may include a main memory and/or a static memory, where such memories may communicate with each other and the processing unit 910 via one or more buses. The memory 920 stores instructions used to implement some or all aspects of methods and processes described herein, including the functions and methods described above with reference to FIGS. 6-8, for example. The memory 920 may be implemented by any number, type and combination of random access memory (RAM) and read-only memory (ROM), for example, and may store various types of information, such as software algorithms, data based models including ANN and other neural network based models, and computer programs, all of which are executable by the processing unit 910. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of computer readable storage medium known in the art. The memory 920 is tangible, and is non-transitory during the time software instructions are stored therein.

The user interface 930 provides information and data output by the processing unit 910 to the user and/or receives information and data input by the user. That is, the user interface 930 enables the user to enter data and to control or manipulate aspects of the processes described herein, and also enables the processing unit 910 to indicate the effects of the user's control or manipulation. The user interface 930 may include a mouse, a keyboard, a trackball, a joystick, a haptic device, a touchpad, a touchscreen, and/or voice or gesture recognition captured by a microphone or video camera, for example, or any other peripheral or control to permit user feedback from and interaction with the processing unit 910. The network interface 940 provides information and data output by the processing unit 910 to other components and/or instruments, e.g., that require one or more of the clock output signals. The network interface 940 may include one or more of ports, drives, or other types of interconnect and/or transceiver circuitry.

The display 950 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 950 may also provide a graphical user interface (GUI) for displaying and receiving information to and from the user operating in conjunction with the user interface 930.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit" or "system." Furthermore, aspects of the present invention may take the form of a computer program product embodied in one or more computer readable medium(s) having computer executable code embodied thereon.

While representative embodiments are disclosed herein, one having ordinary skill in the art appreciates that many variations that are in accordance with the present teachings are possible and remain within the scope of the appended claim set. The invention therefore is not to be restricted except within the scope of the appended claims.

The invention claimed is:

1. A system for dynamically reconfiguring a plurality of clock output signals, without clock loss and without glitches, the system comprising:
   an oscillator configured to generate a clock input signal;
   a first dynamic reconfigurable clock divider comprising a first counter configured to output a first clock output signal having a plurality of first periodic cycles in response to a first counting operation on the clock input signal, and to output a first cycle complete signal in response to completion of a current first periodic cycle of the plurality of first periodic cycles after receiving at least one first reconfiguration command, wherein the first clock output signal has a first frequency and a first phase;
   a second dynamic reconfigurable clock divider comprising a second counter configured to output a second clock output signal having a plurality of second periodic cycles in response to a second counting operation on the clock input signal, and to output a second cycle complete signal in response to completion of a current second periodic cycle of the plurality of second periodic cycles after receiving at least one second reconfiguration command, wherein the second clock output signal has a second frequency and a second phase;
   an AND logic gate configured to output an aggregated cycle complete signal in response to receiving both the first cycle complete signal and the second cycle complete signal, wherein the aggregated cycle complete signal is input to the first and second dynamic reconfigurable clock dividers; and
   an interface configured to provide the at least one first reconfiguration command to the first dynamic reconfigurable clock divider, wherein the at least one first reconfiguration command is for changing the first frequency and/or the first phase of the first clock output signal or disabling the first clock output signal, and
   wherein, after the first dynamic reconfigurable clock divider receives the at least one first reconfiguration command, the first counter maintains the first frequency and the first phase until completing the current first periodic cycle of the plurality of first periodic cycles and receiving the aggregated cycle complete signal from the AND logic gate, and then implementing the changed first frequency and/or the changed first phase of the first clock output signal or disabling the first clock output signal.

2. The system of claim 1,
wherein, after the second dynamic reconfigurable clock divider receives the at least one second reconfiguration command, the second counter maintains the second frequency and the second phase until completing the current second periodic cycle of the plurality of second periodic cycles and receiving the aggregated cycle complete signal from the AND logic gate, and then implementing the changed second frequency and/or the changed second phase of the second clock output signal.

3. The system of claim 1,
wherein the first counter is configured to output the first clock output signal having the first frequency by dividing an input frequency of the clock input signal by a first clock divider setting, and
wherein the second counter is configured to output the second clock output signal having the second frequency by dividing the input frequency of the clock input signal by a second clock divider setting.

4. The system of claim 3, wherein the first dynamic reconfigurable clock divider further comprises a first clock/phase controller configured to receive the at least one first reconfiguration command from the interface, and to selectively enable the first counter in response to the at least one first reconfiguration command.

5. The system of claim 4, wherein the at least one first reconfiguration command comprises:
an enable clock command for initiating reconfiguration with regard to the changed first frequency,
a new first clock divider setting for setting the changed first frequency,
an enable phase delay command for initiating reconfiguration with regard to the changed first phase, and
a phase delay setting for setting a phase offset of the changed first phase.

6. The system of claim 4, wherein the first dynamic reconfigurable clock divider further comprises a first spread spectrum controller configured to implement spread spectrum modulation of the first clock output signal in response to first spread spectrum control commands received from the interface.

7. The system of claim 6, wherein the first spread spectrum control commands comprise:
an enable spread spectrum command initiating the spread spectrum modulation implementation;
a spread modulation setting for setting a time period of each modulation cycle in the spread spectrum modulation;
a spread time resolution setting for setting a time of each frequency increment and each frequency decrement within each time period of the modulation cycle; and
a spread frequency resolution setting for setting an amount of each frequency decrement and each subsequent frequency increment relative to a base frequency per each spread time resolution of the first clock output signal within each time period of the modulation cycle.

8. The system of claim 7,
wherein the first counter is further configured to output the first clock output signal as a spread spectrum first clock output signal in response to a spread spectrum clock divider setting from the first spread spectrum controller, and
wherein the first frequency of the spread spectrum first clock output signal comprises transitions between frequency decrements from the base frequency by the amount of the frequency decrement in the spread frequency resolution and frequency increments back to the base frequency by the amount of the frequency increment in the spread frequency resolution, for each spread time resolution occurring in the time period of the modulation cycle.

9. The system of claim 1, wherein the at least one first reconfiguration command and/or the at least one second reconfiguration command comprises a clock divider start signal that causes the first and second dynamic reconfigurable clock dividers to start simultaneously the first and second counting operations of the first and second counters.

10. The system of claim 1, wherein the at least one second reconfiguration command comprises an enable clock command, and
wherein, after the second dynamic reconfigurable clock divider receives the at least one second reconfiguration command, the second counter maintains the second frequency and the second phase until completing the current second periodic cycle of the plurality of second periodic cycles and receiving the aggregated cycle complete signal from the AND logic gate, and then disables the second clock output signal in response to the enable clock command being set to 0.

11. A method for dynamically reconfiguring a plurality of clock output signals, output by a respective plurality of dynamic reconfigurable clock dividers, without clock loss and without glitches, the method comprising:
receiving a clock input signal;
outputting from a first dynamic reconfigurable clock divider a first clock output signal having a plurality of first periodic cycles at a first frequency and a first phase in response to a first counting operation on the clock input signal;
outputting from a second dynamic reconfigurable clock divider a second clock output signal having a plurality of second periodic cycles at a second frequency and a second phase in response to a second counting operation on the clock input signal;
receiving at least one first reconfiguration command at the first dynamic reconfigurable clock divider changing at least one of the first frequency or the first phase of the first clock output signal;
outputting from the first dynamic reconfigurable clock divider a first cycle complete signal in response to completion of a current first periodic cycle of the plurality of first periodic cycles after receiving at the least one first reconfiguration command;
outputting from the second dynamic reconfigurable clock divider a second cycle complete signal in response to completion of a current second periodic cycle of the plurality of second periodic cycles after receiving at the least one first reconfiguration command;
providing an aggregated cycle complete signal in response to receiving both the first cycle complete signal and the second cycle complete signal;
inputting the aggregated cycle complete signal to the first and second dynamic reconfigurable clock dividers; and
in response to the at least one first reconfiguration command, maintaining the first frequency and the first phase until completing the current first periodic cycle of the plurality of first periodic cycles and receiving the aggregated cycle complete signal, and then implementing the changed first frequency and/or the changed first phase.

12. The method of claim 11, wherein providing the aggregated cycle complete signal comprises performing an AND logic operation on the first cycle complete signal and the second cycle complete signal.

13. The method of claim 11, further comprising:
receiving at least one second reconfiguration command at the second dynamic reconfigurable clock divider changing at least one of the second frequency or the second phase of the second clock output signal; and
in response to the at least one second reconfiguration command, maintaining the second frequency and the second phase until completing the current second periodic cycle of the plurality of second periodic cycles and receiving the aggregated cycle complete signal, and then implementing the changed second frequency and/or the changed second phase.

14. The method of claim 11,
wherein the first counting operation comprises dividing an input frequency of the clock input signal by a first clock divider setting to obtain the first frequency, and
wherein the second counting operation comprises dividing the input frequency of the clock input signal by a second clock divider setting to obtain the second frequency.

15. The method of claim 11, wherein the at least one first reconfiguration command comprises an enable spread spectrum command, the method further comprising:
performing spread spectrum modulation on the first output clock signal in response to the enable spread spectrum command.

16. The method of claim 15, wherein performing the spread spectrum modulation comprises:
setting a time period of each modulation cycle in the spread spectrum modulation;
setting a time of each frequency increment and each frequency decrement within each time period of the modulation cycle; and
setting an amount of each frequency decrement and each subsequent frequency increment relative to a base frequency per each spread time resolution of the first clock output signal within each time period of the modulation cycle.

17. The method of claim 16, wherein the at least one first reconfiguration command received at the first dynamic reconfigurable clock divider further changes at least one of the spread spectrum modulation, the spread time resolution, or spread frequency resolution time period, the method further comprising:
maintaining the at least one of the spread spectrum modulation, the spread time resolution, or the spread frequency resolution time period until completing the current first periodic cycle of the plurality of first periodic cycles and receiving the aggregated cycle complete signal, and then implementing the changed the at least one of the spread spectrum modulation, the spread time resolution, or the spread frequency resolution time period.

18. The method of claim 11, further comprising:
receiving at least one second reconfiguration command at the second dynamic reconfigurable clock divider for disabling the second clock output signal; and
after receiving the at least one second reconfiguration command, maintaining the second frequency and the second phase until completing the current second periodic cycle of the plurality of second periodic cycles and receiving the aggregated cycle complete signal, and then disabling the second clock output signal.

19. A device for dynamically reconfiguring a clock output signal, without clock loss and without glitches, the device comprising:
an interface;
a first counter configured to output a first clock output signal having a plurality of first periodic cycles in response to a first counting operation on a clock input signal;
a first clock/phase controller configured to receive at least one first reconfiguration command from the interface, to selectively enable the first counter in response to the at least one first reconfiguration command, and to output a first cycle complete signal in response to completion of a current first periodic cycle of the plurality of first periodic cycles after receiving the at least one first reconfiguration command, wherein the first clock output signal has a first frequency and a first phase; and
an AND logic gate configured to output an aggregated cycle complete signal in response to receiving the first cycle complete signal and a second cycle complete signal from a second clock/phase controller in another device,
wherein the first clock/phase controller is further configured to maintain the first frequency and the first phase until completing the current first periodic cycle of the plurality of first periodic cycles, to receive the aggregated cycle complete signal from the AND logic gate, and to then implement the changed first frequency and/or the changed first phase of the first clock output signal further to the at least one first reconfiguration command.

20. The device of claim 19, further comprising: a first spread spectrum controller configured to receive the at least one first reconfiguration command from the interface, and to selectively implement spread spectrum modulation of the first clock output signal in response to first spread spectrum control commands of the at least one first reconfiguration command.

* * * * *